United States Patent [19]

Wagner

[11] 4,017,805
[45] Apr. 12, 1977

[54] COMPENSATED ELECTRON BEAM DEFLECTION DEVICE

[75] Inventor: Herbert M. Wagner, Belmar, N.J.

[73] Assignee: The United States of America as represented by the Secretary of the Army, Washington, D.C.

[22] Filed: Jan. 8, 1976

[21] Appl. No.: 647,684

[52] U.S. Cl. .................................. 330/33; 330/34; 330/43; 330/46
[51] Int. Cl.² ...................... H03F 3/10; H03F 3/54
[58] Field of Search .................. 330/34, 33, 43, 44, 330/46, 149; 315/13 R

[56] References Cited

UNITED STATES PATENTS

| 2,459,724 | 1/1949 | Selgin | 315/13 X |
|---|---|---|---|
| 2,632,127 | 3/1953 | Wagner | 315/13 |
| 2,927,243 | 3/1960 | Cutler | 315/13 R X |
| 3,725,803 | 4/1973 | Yoder | 330/46 |

Primary Examiner—James B. Mullins
Attorney, Agent, or Firm—Nathan Edelberg; Edward Goldberg; Jeremiah G. Murray

[57] ABSTRACT

An electron beam deflection amplifier having two spaced parallel electron beams and a pair of spaced collector electrodes for intercepting the beams to provide an output beam current. The beams are deflected in opposite directions by the input signal to be amplified but are deflected in the same direction by external undesired stray fields. The collector electrodes are dimensioned and relatively positioned such that variable portions of both beams will be collected at both electrodes. Each collector electrode will intercept a portion of each beam and the portion of each beam not intercepted by one collector electrode will be intercepted by the other collector electrode. For desired input signals, the collector current outputs are additive. A stray magnetic field will deflect the electron beams in the same direction in which case the output current due to one beam substracts and cancels the output current from the other beam. In this manner the effect of external fields are compensated for and nullified.

15 Claims, 7 Drawing Figures

COMPENSATED ELECTRON BEAM DEFLECTION DEVICE

The invention described herein may be manufactured, used or licensed by or for the Government for governmental purposes without payment of any royalties thereon.

BACKGROUND OF THE INVENTION

This invention relates to electron beam deflection devices and more particularly to electron beam deflection amplifiers.

Electron beam deflection type tubes are well known devices used to provide RF signal amplification. For good reproduction of amplified signals, such amplifiers must be designed to provide excellent sensitivity characteristics. Such characteristics assure that small variations of beam deflection produce corresponding large variations in output current thereby enhancing the usefulness of such devices as high-gain RF amplifiers. Heretofore, electron beam deflection amplifiers generally utilized a single electron beam wherein the amplified output signal is a function of the beam deflections resulting from the input signal. One of the problems experienced in the operation of such sensitive, single electron beam deflection amplifiers is the effect of stray magnetic fields external to the device. Such fields arise from the earth's magnetic field, from steel and other magnetic materials, from power transformers and other equipment components proximate to the amplifier. With static fields, this is equivalent to a stray deflection bias. Variable fields emanating from power equipment and power line transformers cause stray modulation of the electron beam, which, in turn, causes extraneous modulation of the output amplified signal. In highly sensitive beam devices such as those utilizing electron bombarded semiconductor (EBS) target elements, for example, these stray external fields are very detrimental to the operation of the amplifier and may even destroy its usefulness. While such tubes may, to a certain extent, be provided with external shielding means, such shielding is highly undesirable since it is rather cumbersome, requires a great deal of space and adds unwanted weight. Also, at high voltages the metallic shielding material may cause arc-overs or unwanted corona effects.

BRIEF SUMMARY OF THE INVENTION

It is an object of the present invention to provide an improved electron beam deflection amplifier wherein the aforementioned limitations are overcome.

In accordance with the present invention there is provided an improved electron beam deflection amplifier. Included are means for generating a pair of spaced parallel longitudinal electron beams and a pair of longitudinally spaced collector electrodes for intercepting portions of each of said beams. Also included are means responsive to the outputs of the collector electrodes to produce an output current and means intermediate the electron beams and responsive to applied input signals for transversely deflecting the beams in opposite directions. The spaced collector electrodes are dimensioned and positioned relative to the electron beams such that when the beams are transversely deflected in opposite directions, the respective collector electrode beam current due to both beams are additive at each of the collector electrodes but when the beams move in the same direction the respective collector beam currents due to both beams are negated or cancelled at each of the collector electrodes.

DESCRIPTION OF THE PREFERRED EMBODIMENT

Figure 1:
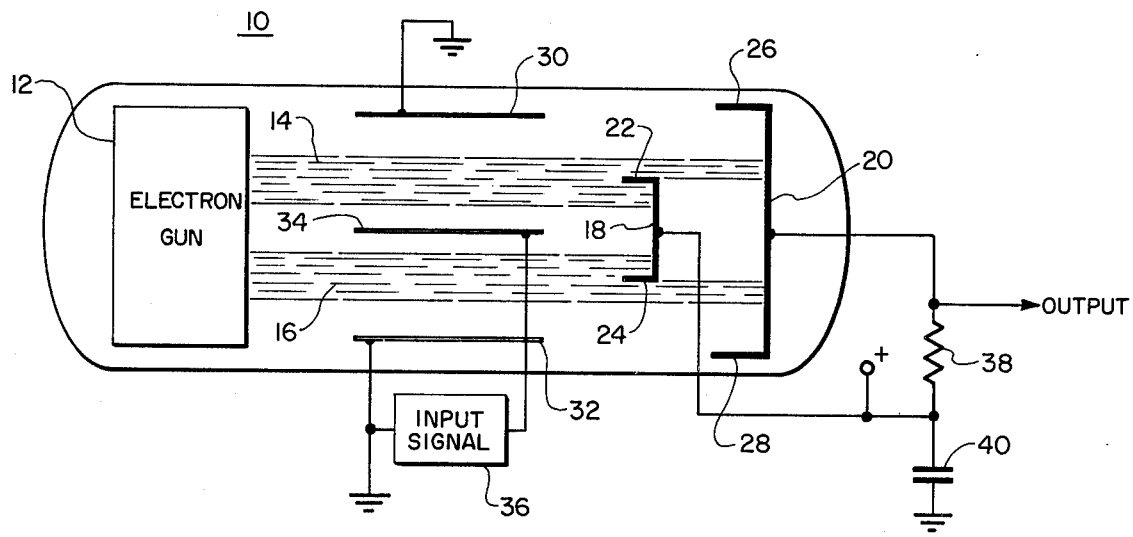
FIG. 1 illustrates a preferred embodiment of the invention.

Referring now to FIG. 1 of the drawing, at 10 there is shown an electron beam deflection amplifier having at one end thereof an electron gun structure 12. Electron gun 12 is adapted to provide closely spaced, substantially parallel, electron beams 14 and 16, preferably planar ribbon type beams which are identical in size and shape. Beams 14 and 16 are parallel to and symmetrically spaced on either side of the longitudinal axis of tube 10 in a plane perpendicular to the plane of the paper. The electron beams 14 and 16 should be spaced as close as practical so that they will both be affected in the same manner by external magnetic fields and yet not interfere with each other under normal operating conditions. Spaced from gun 12 at the other end of tube 10 are a pair of longitudinally spaced, substantially parallel collector electrodes 18 and 20 for intercepting the electron beams 14 and 16 as described below. Collector electrodes 18 and 20 are preferably planar rectangular metal plates which are preferably provided with respective upper and lower flanges extending towards the electron gun 12. Collector electrode 18 is proximal electron gun 12 and is dimensioned such that its respective flanges 22 and 24 are substantially in the longitudinal center of respective electron beams 14 and 16 under static conditions. Collector electrode 20 is greater in height than collector electrode 18 and its respective flanges 26 and 28 are positioned external the electron beams 14 and 16. The collector electrodes 18 and 20 are spaced relatively close but enough space is provided therebetween to preclude any interaction. Collector electrode 20 is dimensioned such that under static conditions, one-half of each electron beam is intercepted by respective collector electrodes 18 and 20 and, for other beam positions, collector electrodes 18 and 20 will intercept variable portions of the beams. Thus under static conditions, one half of beam 14 is intercepted by collector electrode 18 and the other half of beam 14 is intercepted by collector electrode 20. Similarly one half of beam 16 is intercepted by collector electrode 18 and the other half of beam 16 is intercepted by collector electrode 20. For all other positions of beams 14 and 16 it is essential that each beam be simultaneously intercepted by both collector electrodes. Thus that portion of beam 14 which is not intercepted by collector electrode 18 will be intercepted by collector electrode 20. Similarly, that portion of beam 16 not intercepted by collector electrode 18 will be intercepted by collector electrode 20. Longitudinally disposed deflection electrodes 30 and 32 are respectively positioned close to the distal edges of respective electron beams 14 and 16 but equally spaced therefrom. Another longitudinally disposed deflection electrode 34 is positioned intermediate the proximal edges of electron beams 14 and 16 and equally spaced therefrom. For purposes of clarity, deflection electrodes 30 and 32 will be referred to as outer deflection electrodes and electrode 34 will be referred to as the inner deflection electrode. The outer deflection electrodes 30 and 32 are at the same potential, preferably ground, and the input signal from source 36 is applied to the inner electrode 34. The output signal is preferably derived from output impedance load 38, one end of which is connected to collector electrode 20 and the other end is bypassed to ground through capacitor 40. A suitable positive potential is applied directly to collector electrode 18 and to collector electrode 20 through load resistor 38. If desired, the impedance load 38 may be connected to collector electrode 18 instead of collector electrode 20 to provide an output signal. Also, electrodes 18 and 20 may be connected to provide push-pull operation. For purposes of clarity, the conventional electron gun voltages and conventional beam forming voltages are not shown since they are well known in the art.

Figure 2:
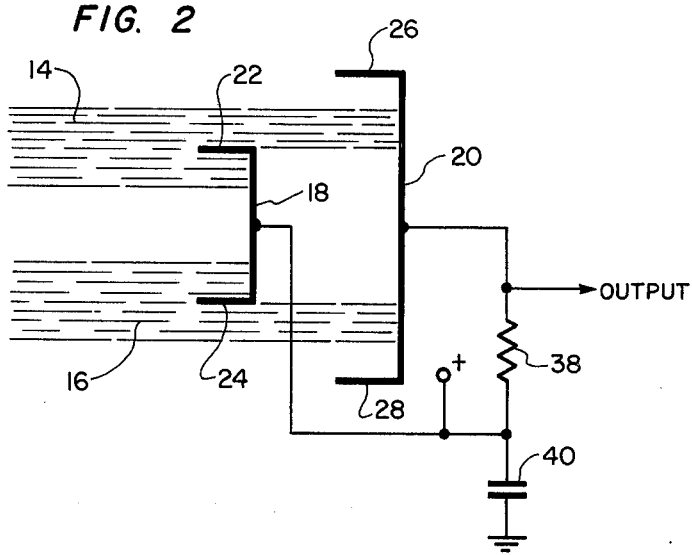
FIGS. 2–5 are fragmentary drawings which illustrate the operation of the invention.

In operation, the input signal to be amplified is applied between inner deflection electrode 34 and the outer deflection electrodes 30 and 32. The applied input signal deflection voltage causes the respective beams 14 and 16 to move in opposite directions. Thus for applied input signals, the electron beams 14 and 16 will either move towards each other or away from each other depending on the polarity of the input signal applied to inner deflection electrode 34. This is clearly shown in FIGS. 2, 3 and 4. Assuming that under static conditions electron beams 14 and 16 are positioned such that the respective flanges 22 and 24 of collector electrode 18 are positioned in the respective centers of beams 14 and 16, then under such static conditions one half of each of the beam currents will be collected by collector electrode 18 and one half of each of the beam currents will be collected by electrode 20 so that the output beam currents in both electrodes will be equal. This is shown in FIG. 2.

Figure 3:
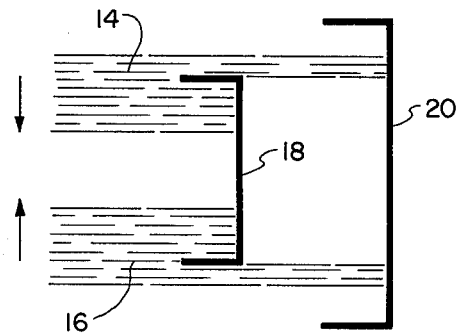
Figure 4:
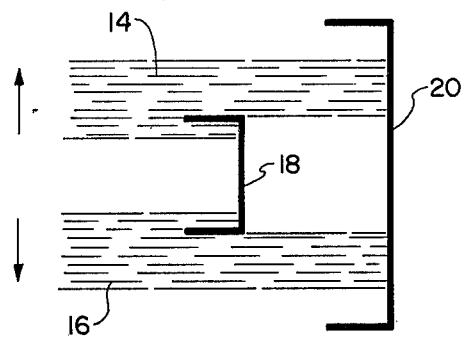

Referring now to FIG. 3, it is assumed that the input signal applied from source 36 to inner deflection electrode 34 is positive. Both beams will now be deflected inwardly towards each other, one up and one down, as indicated by the arrows. Since both beams will react equally to the applied input signal, the position of the beams 14 and 16 will now be displaced from their static position shown in FIG. 2. Since greater equal portions of respective electron beams 14 and 16 now intercept collector electrode 18, than under static conditions, there will be an increase in current from collector electrode 18. Simultaneously, lesser equal portions of respective electron beams 14 and 16 now intercept collector electrode 20. The quantity or degree of interception will of course be a function of the amplitude of the applied input signal from source 36. The effect of a negative input signal is shown in FIG. 4. Beam 14 now moves up and beam 16 now moves down in the directions indicated by the arrows. Both beams move in opposite directions but away from each other. The effect of the respective beams on the respective collector electrodes is opposite to that shown in FIG. 3. Thus in FIG. 4, greater equal portions of the respective beams are intercepted by collector electrode 20 while lesser equal portions of the respective electron beams intercept collector electrode 18. However in both FIGS. 3 and 4, the change in current to either of the output collector electrodes 18 and 20 is additive.

Figure 5:
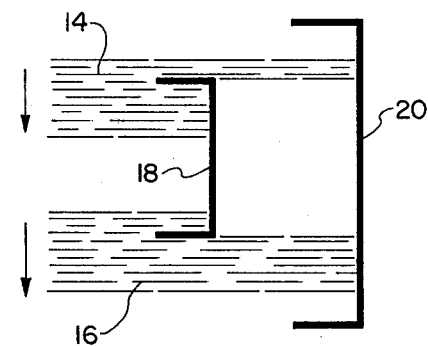

With beams 14 and 16 arranged sufficiently close together and approximately parallel as indicated above, then a stray external magnetic field will deflect beams 14 and 16 equally but in the same direction, rather than in opposite directions as for the applied input signals. This condition is shown in FIG. 5. It can be seen that the change in collector electrode beam currents are subtractive, that is, the current changes to either collector electrode compensate each other. While beam 14 tends to provide an increase in beam current from electrode 18, there is a corresponding decrease in beam current from collector electrode 20. Similarly while beam 16 tends to provide an increase in beam current from electrode 20, there is a corresponding decrease in beam current from collector electrode 18. Hence with deflection in the same direction caused by an external stray field, whatever current change is produced by one beam on one collector electrode is compensated for or negated by an equal and opposite change in current from the other beam. Accordingly, while applied input signals produce additive collector electrode currents, the effect of stray fields will be negated or subtractive.

Figure 6:
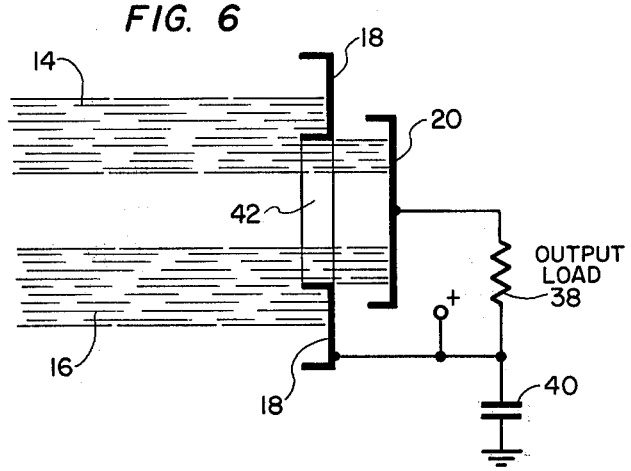
FIGS. 6 and 7 illustrate other embodiments of the invention.

FIG. 6 illustrates another embodiment of the invention. In FIG. 6, electrode 18 comprises an apertured collector electrode which is greater in size than collector electrode 20. As in FIGS. 2–5, the portions of the electron beams 14 and 16 not intercepted by collector electrode 18 will be intercepted by collector electrode 20. Collector 18 is so positioned that its aperture 42 provides passage for electron beams 14 and 16 to collector electrode 20.

While it is well known that the up and down deflection of the beams 14 and 16 is the deflection of high sensitivity, there will also be some deflection due to external magnetic field that goes in and out of the plane of the paper. However this direction of deflection is relatively insensitive insofar as causing any change in output current whether or not the beams are deflected in the same or opposing directions. This is particularly true if the length of the collector electrodes in and out of the plane of the paper exceeds that of the electron beam, that is, the beam never goes beyond the length of the collector electrodes. Although collector electrodes 18 and 20 are described as being metallic plates, an electron bombarded semiconductor (EBS) may be substituted therefor. Such EBS diodes are known to act as current multipliers which can pass extremely large currents in response to small electron bombardment currents.

Figure 7:
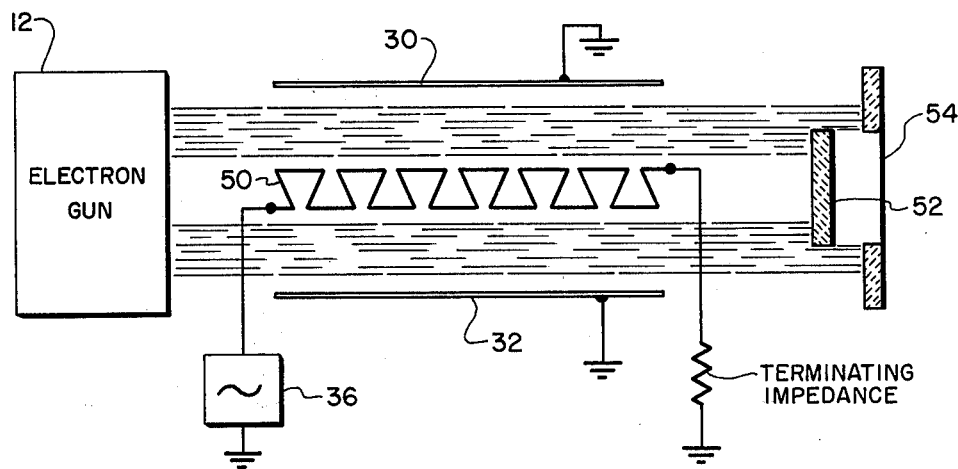

FIG. 7 illustrates an embodiment of my invention utilizing electron bombarded semiconductor (EBS) devices. Referring now to FIG. 7, the inner or input electrode comprises an slow wave structure such as the serpentine line 50. In place of the metallic collector electrodes, there are provided the longitudinally spaced EBS diodes 52 and 54. The operation of FIG. 7 is substantially identical to that described in connection with FIG. 1.

What is claimed is:
1. An electron beam deflection amplifier comprising:
   means for generating a pair of like spaced parallel longitudinal electron beams, said beams being normally positioned symmetrically about a longitudinal axis;
   a pair of longitudinally spaced collector electrodes, each of said electrodes being disposed symmetrically about said longitudinal axis and across the path of both beams to intercept respective portions of each of said beams;

output means responsive to the outputs of said collector electrodes to produce an output current;

electrode means extending axially intermediate said beams and symmetrical with respect to said normal position of said beams and being responsive to applied input signals for transversely deflecting said beams in opposite directions about said longitudinal axis;

said longitudinally spaced collector electrodes being so positioned relative to said beams such that when said beams are transversely deflected in opposite directions the beam current of one beam on one electrode increases and decreases in correspondence with the beam current of the other beam on said one electrode so that the respective collector electrode beam currents due to both beams are additive at each of said electrodes; and when said beams move transversely in the same direction the beam current of one beam on one electrode changes oppositely from the beam current of the other beam on said one electrode so that the respective collector beam currents due to both beams are negated at each of said electrodes.

2. The deflection amplifier in accordance with claim 1 wherein one of said electrodes is smaller to intercept inner portions of said beams and the other electrode is larger to intercept outer portions of said beams, those portions of each of the respective beams not intercepted by one collector electrode being intercepted by other collector electrode.

3. The deflection amplifier in accordance with claim 2 wherein the collector electrode proximal said beam generating means is an apertured electrode larger than the other electrode.

4. The deflection amplifier in accordance with claim 2 wherein the collector electrode proximal said beam generating means is the smaller of said pair of electrodes, said electrodes being in the form of parallel plates disposed one behind the other.

5. The deflection amplifier in accordance with claim 1 wherein said transverse deflecting means comprise an inner deflection electrode intermediate the proximal edges of said electron beams, and a pair of outer deflection electrodes spaced respectively from the distal edges of said electron beams, said outer deflection electrodes being connected to a common terminal and said input signals being applied between said common terminal and said intermediate deflection electrode.

6. The deflection amplifier in accordance with claim 5 wherein, the collector electrode proximal said beam generating means is the smaller of said pair of collector electrodes.

7. The deflection amplifier in accordance with claim 6 wherein each of said collector electrodes intercept portions of both of said beams, that portion of the respective beams not intercepted by said smaller collector electrode being intercepted by the other collector electrode.

8. The deflection amplifier in accordance with claim 2 wherein the collector electrodes are positioned such that under static conditions half of each beam is intercepted by said one collector electrode and the remaining half of each beam is intercepted by said other collector electrode.

9. The deflection amplifier in accordance with claim 6 wherein the collector electrodes are positioned such that under static conditions half of each beam is intercepted by said smaller collector electrode and the remaining half of each beam is intercepted by the other collector electrode.

10. The deflection amplifier in accordance with claim 5 wherein said intermediate deflection electrode is a serpentine slow-wave transmission line.

11. The deflection amplifier in accordance with claim 1 wherein said collector electrodes comprise electron bombarded semiconductor diodes.

12. The deflection amplifier in accordance with claim 10 wherein said collector electrodes comprise electron bombarded semiconductor diodes.

13. The deflection amplifier in accordance with claim 6 wherein said intermediate deflection electrode is a serpentine slow-wave transmission line and said collector electrodes are electron bombarded semiconductor diodes.

14. The deflection amplifier in accordance with claim 13 wherein said semiconductor diodes are positioned such that under static conditions half of each beam is intercepted by said smaller semiconductor diode and half of each beam is intercepted by the other semiconductor diode.

15. The deflection amplifier in accordance with claim 2 wherein said collector electrodes comprise electron bombarded semiconductor diodes.

* * * * *